United States Patent
Chu et al.

(10) Patent No.: US 9,343,465 B2
(45) Date of Patent: May 17, 2016

(54) INTEGRATED CIRCUIT FOR HIGH-VOLTAGE DEVICE PROTECTION

(71) Applicant: Taiwan Semiconductor Manufacturing Co., Ltd., Hsin-Chu (TW)

(72) Inventors: Chen-Liang Chu, Hsin-Chu (TW); Ruey-Hsin Liu, Hsin-Chu (TW); Chih-Wen Albert Yao, Hsinchu (TW); Ming-Ta Lei, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/472,496

(22) Filed: Aug. 29, 2014

(65) Prior Publication Data

US 2016/0064394 A1  Mar. 3, 2016

(51) Int. Cl.

| | |
|---|---|
| *H01L 29/788* | (2006.01) |
| *H01L 27/115* | (2006.01) |
| *H01L 29/66* | (2006.01) |
| *H01L 29/49* | (2006.01) |
| *H01L 29/423* | (2006.01) |
| *H01L 21/28* | (2006.01) |
| *H01L 21/02* | (2006.01) |
| *H01L 21/265* | (2006.01) |

(52) U.S. Cl.
CPC ...... *H01L 27/11521* (2013.01); *H01L 21/0223* (2013.01); *H01L 21/26513* (2013.01); *H01L 21/28035* (2013.01); *H01L 21/28273* (2013.01); *H01L 27/11526* (2013.01); *H01L 29/42328* (2013.01); *H01L 29/4916* (2013.01); *H01L 29/66825* (2013.01); *H01L 29/7883* (2013.01); *H01L 21/02255* (2013.01)

(58) Field of Classification Search
None
See application file for complete search history.

(56) References Cited

U.S. PATENT DOCUMENTS

2007/0241386 A1* 10/2007 Wang et al. ............... 257/314
2014/0264538 A1*  9/2014 Yu et al. .................... 257/316

* cited by examiner

*Primary Examiner* — Daniel Whalen
(74) *Attorney, Agent, or Firm* — Eschweiler & Associates, LLC

(57) ABSTRACT

Some embodiments of the present disclosure are directed to an embedded flash (e-flash) memory device that includes a flash memory cell and a metal-oxide-semiconductor field-effect transistor (MOSFET). The flash memory cell includes a control gate disposed over a floating gate. The MOSFET includes a logic gate disposed over a gate dielectric. The floating gate and a first gate layer of the logic gate are simultaneously formed with a first polysilicon layer. A high temperature oxide (HTO) is then formed over the floating gate with a high temperature process, while the first gate layer protects the gate dielectric from degradation effects due to the high temperature process. A second gate layer of the logic gate is then formed over the first gate layer by a second polysilicon layer. The first and second gate layers collectively form a logic gate of the MOSFET.

20 Claims, 14 Drawing Sheets

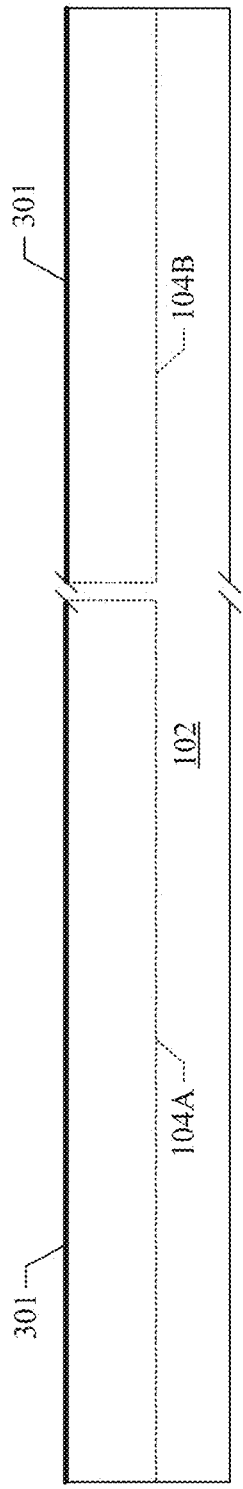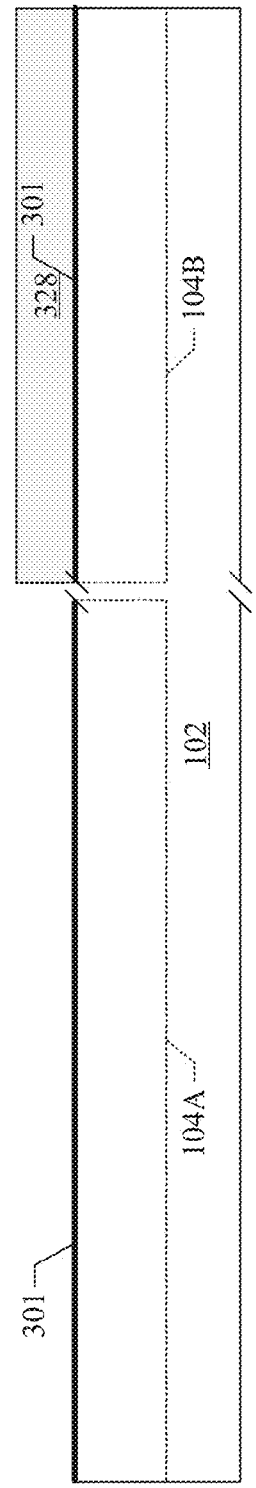

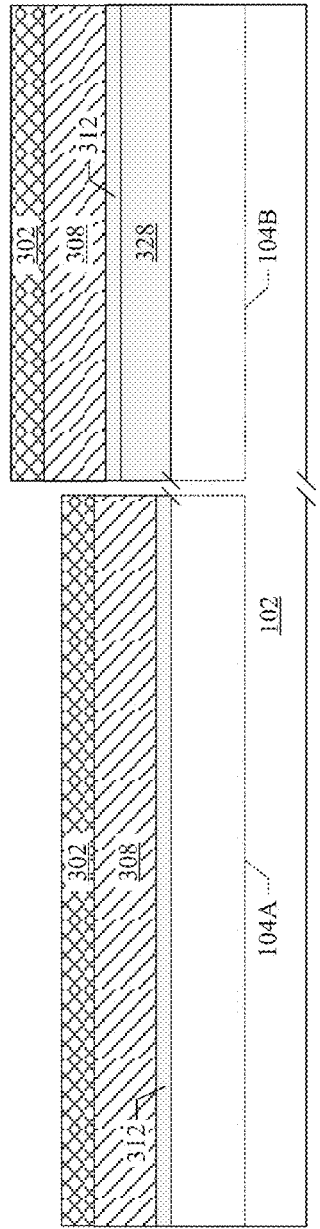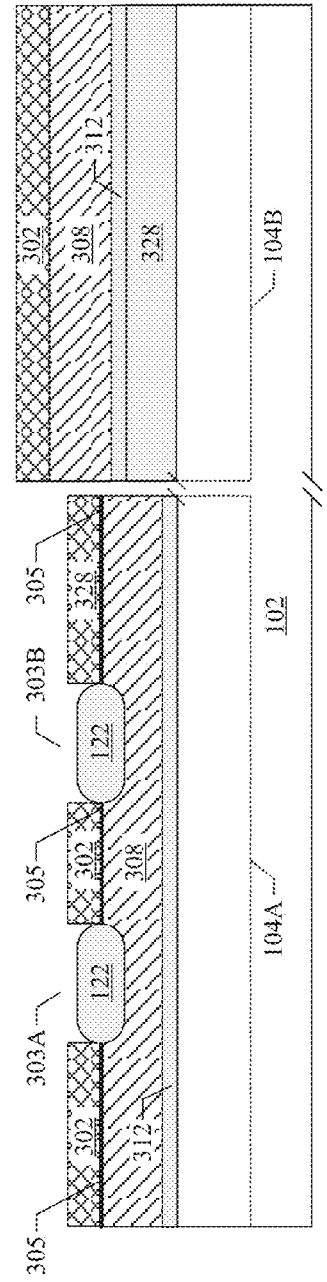

INTEGRATED CIRCUIT FOR HIGH-VOLTAGE DEVICE PROTECTION

BACKGROUND

Moore's Law dictates that the number of devices per unit area of an integrated circuit (IC) double with each successive technology node. This simple law drives a decrease in cost and an increase in performance between successive generations of the IC. To support such scaling, a minimum feature size (e.g., gate width, etc.) for the devices within the IC is accordingly decreased. To support such aggressive scaling, new fabrication methods such as double-patterning, self-aligned contact formation, and the like, have been introduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
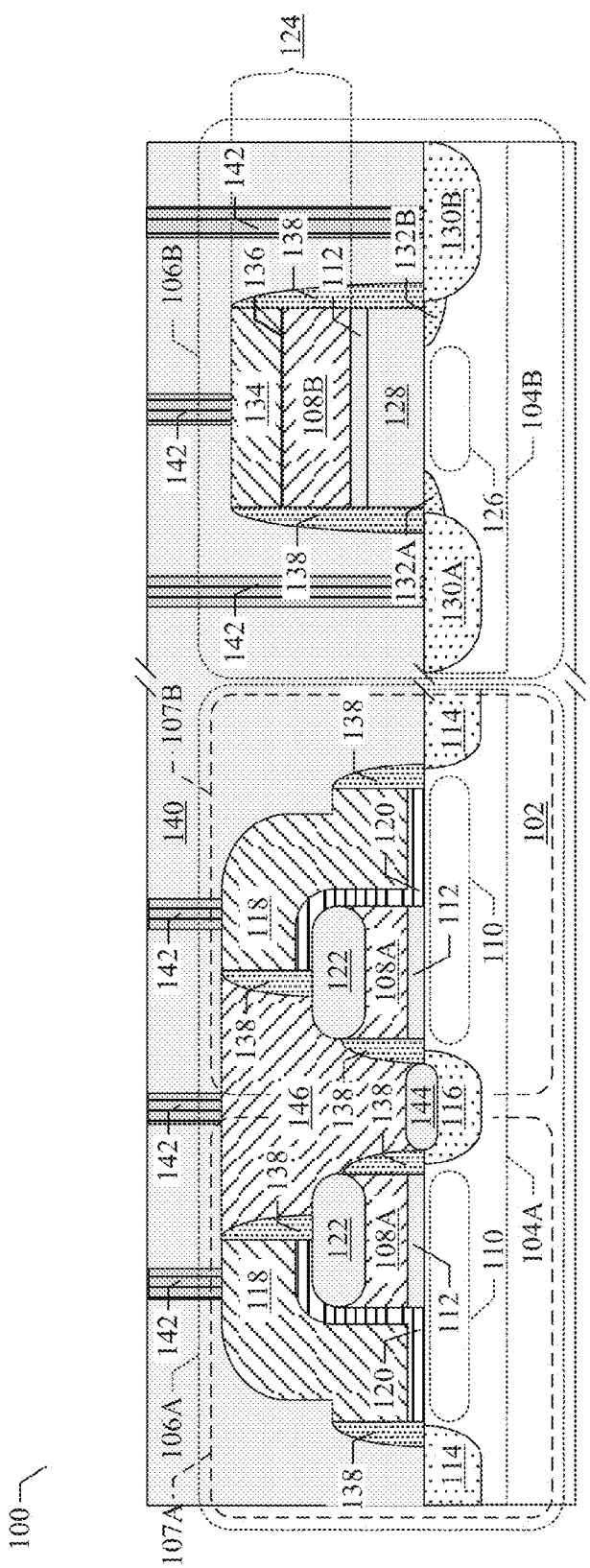
FIG. 1 illustrates a cross-sectional view of an embedded flash memory device that includes a metal-oxide-semiconductor field-effect transistor (MOSFET) and a split gate flash memory cell formed on a semiconductor substrate, according to one or more embodiments.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/ or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in the semiconductor manufacturing industry is to integrate different circuit components into a single semiconductor substrate. Such integration advantageously allows lower manufacturing costs, simplified fabrication procedures, and increased operational speed. One type of semiconductor device often integrated into a single semiconductor substrate is a flash memory device. A flash memory device includes logic devices and an array of flash memory cells. The logic devices may include, for example, address decoders or read/write circuitry, to support operation of the flash memory device. When the array of flash memory cells and the logic devices are integrated into a single semiconductor substrate, the flash memory device is often referred to as an "embedded flash" (e-flash) memory device.

The logic device of the e-flash memory device includes a metal-oxide-semiconductor field-effect transistor (MOSFET). The MOSFET utilizes a logic gate formed over a channel region of the MOSFET, which is separated from a channel region of the MOSFET by a gate dielectric (e.g., $SiO_2$). The e-flash memory device also includes an array of flash memory cells. A flash memory cell includes a floating gate that is formed over a channel region of the flash memory cell, and a control gate that is formed over the floating gate. The floating gate is separated from the channel region of the flash memory cell by a tunneling dielectric, and is also separated from the control gate by a high temperature oxide (HTO). As such, the floating gate is electrically isolated from both, such that electric charge stored within floating gate will remain there indefinitely.

To form such an e-flash memory device, two polysilicon deposition steps are used: one for the floating gate and one for the control gate. To reduce manufacturing costs and simplify the common fabrication process, the logic gate of the MOSFET can be formed using the same polysilicon layer as either the floating gate or the control gate. However, both options introduce potential yield detractors for the MOSFET. For example, a comparatively thin polysilicon layer is used to form the floating gate to insure correct write/erase functionality of the flash memory cell. Consequently, if the logic gate is formed from the same thin polysilicon layer as the floating gate, then the logic gate may not be thick enough to block subsequent source/drain dopant implants from penetrating through the logic gate and into the channel region of the MOSFET. The implanted dopants within the channel region of the MOSFET can degrade the characteristics of the MOSFET, or even short the source and drain of the MOSFET together.

Forming the logic gate from the same polysilicon layer as the control gate can also be problematic. The polysilicon layer that forms the control gate is thick enough to withstand the source/drain dopant implants, but is formed after the HTO layer. For robustness and uniform separation of the control and floating gates, the HTO layer is formed using a high temperature process (e.g., thermal oxidation), which exposes other areas of the semiconductor substrate to the high temperature. Therefore, if the polysilicon layer that forms the control gate is used to form the logic gate of the MOSFET after the high temperature process, then the gate dielectric is left exposed during the high temperature process. Thermal stressing of the exposed gate dielectric during the high temperature process degrades a uniformity of the gate dielectric (e.g., thickness, density, etc.), which in turn degrades yield and performance of the MOSET. In particular, damage to the gate dielectric can result in a variation in the $V_{th}$, drain saturation current ($I_{dsat}$), or other device characteristics of the MOSFET.

In view of the foregoing, some embodiments of the present disclosure are directed to an e-flash memory device and method of forming the same. A semiconductor fabrication process used to manufacture the e-flash memory device targets formation of a flash memory cell, which includes a control gate disposed over a floating gate. The semiconductor fabrication process simultaneously targets formation of a MOSFET, which includes a logic gate disposed over a gate dielectric. The floating gate and a first gate layer of the logic gate are simultaneously formed with a first polysilicon layer. A high temperature oxide (HTO) is then formed over the floating gate with a high temperature process, while the first gate layer protects the gate dielectric from degradation effects due to the high temperature process. A second gate layer of the logic gate is then formed over the first gate layer by a second polysilicon layer, which is structurally distinct from the first polysilicon layer. The first and second gate layers collectively form a logic gate of the MOSFET, and include a sufficient thickness to protect a channel region of the MOSFET from dopant contamination during subsequent source/drain implantation steps. Other embodiments are also disclosed.

FIG. 1 illustrates a cross-sectional view of an embedded flash (e-flash) memory device 100, according to one or more embodiments of the present disclosure. The e-flash memory device 100 includes split gate flash memory cell 106A formed over a memory region 104A of a semiconductor substrate 102, and a metal-oxide-semiconductor field-effect transistor (MOSFET) 106B formed over a logic region 104B of the semiconductor substrate 102.

The split gate flash memory cell 106A includes a pair of the memory cells 107A, 107B having a common source region 116 and individual drain regions 114, which are laterally separated by a channel region 110 of each memory cell 107A, 107B. Each memory cell 107A, 107B includes a floating gate 108A separated from the channel region 110 by a tunneling dielectric 112 (e.g., SiO$_2$). A control gate 118 is disposed over a portion of the floating gate 108A and along a drain facing sidewall of the floating gate 108A. The control gate 118 isolated from the floating gate 108A by an insulating layer 120. In some embodiments, the insulating layer 120 includes a high temperature oxide (HTO) layer formed by one or more high temperature processes (e.g., thermal oxidation). In some embodiments, the insulating layer 120 includes one or more oxide layers, one or more nitride layers, or a combination thereof, such as an oxide-nitride-oxide (ONO) tri-layer, wherein one or both oxides are formed through a high temperature process. Each memory cell 107A, 107B also includes an oxide layer 122 disposed on an upper surface of the floating gate 108A, below the insulating layer 120 and the control gate 118. The oxide layers 122 of memory cells 107A, 107B promote an electric field that is substantially lateral under biasing of the control gates during program and erase modes of the split gate flash memory cell 106A, which promotes efficient tunneling of electrons between the floating gates 108A and the control gates 118. The split gate flash memory cell 106A includes an erase gate 146 disposed between the pair of floating gates 108A and over the common source region 116. The erase gate 146 is electrically isolated from the common source region 116 by a second oxide layer 144.

The MOSFET 106B includes a logic gate 124 arranged over a channel region 126 of the MOSFET 106B. The logic gate 124 is separated from the channel region 126 of the MOSFET 106B by a gate dielectric 128. The channel region 126 of the MOSFET 106B also separates first and second source/drain regions 130A, 130B of the MOSFET 106B. First and second lightly doped drain (LDD) regions 132A, 132B are disposed between the first and second source/drain regions 130A, 130B and channel region 126 of the MOSFET 106B, respectively, and are configured to reduce hot carrier effects within the MOSFET 106B. The logic gate 124 of the MOSFET 106B includes a first gate layer 108B (e.g., polysilicon) arranged below a second gate layer 134 (e.g., polysilicon). The first and second gate layers 108B, 134 are structurally distinct from one another (e.g., having crystalline "grains" with different sizes between the two layers). Consequently, the first and second gate layers 108B, 134 can abut one another at a seam 136, which makes the first and second gate layers 108B, 134 distinct.

Sidewall spacers 138 (e.g., oxide, nitride, etc.) are disposed along sidewalls of the floating gates 108A, the control gates 118, and the logic gate 124. Contacts 142 (e.g., tungsten) are individually formed to the control gates 118, the select gate 146, the first and second source/drain regions 130A, 130B, and the logic gate 124, within an inter-layer dielectric (ILD) 140 disposed over the e-flash memory device 100. Contacts to the common source region 116 and individual drain regions 114 of the split gate flash memory cell 106A are formed along a different cross sectional view (not shown).

The floating gate 108A of the split gate flash memory cell 106A and the first gate layer 108B of the MOSFET 106B have substantially a same thickness as one another. This is a consequence of forming the floating gate 108A and the first gate layer 108B in a single fabrication step (i.e., from a single polysilicon layer that is disposed and patterned in a single fabrication step). By sharing a common polysilicon process between the split gate flash memory cell 106A and the MOSFET 106B, the cost and complexity of manufacturing the e-flash memory device 100 is reduced. However, because the common polysilicon process is targeted for the split gate flash memory cell 106A, it produces a non-optimal result for the logic gate 124 of the MOSFET 106B. For example, formation of the first and second source/drain regions 130A, 130B and/or formation of the first and second LDD utilizes an implant of dopants performed after formation of the first gate layer 108B. However, because thickness of the floating gate 108A is limited by write/erase performance of the split gate flash memory cell 106A, the first gate layer 108B is not thick enough to prevent the dopants from penetrating into the channel region 126 of the MOSFET 106B. Accordingly, the second gate layer 134 is formed by an additional polysilicon process targeted towards enhancing the performance of the MOSFET 106B. The first and second gate layers 108B, 134 combine to have a thickness that is sufficiently large enough to prevent dopant implantation into the channel region 126 of the MOSFET 106B. Therefore, the common polysilicon process augmented with the additional polysilicon process that in combination enhance yield and performance of both the split gate flash memory cell 106A and the MOSFET 106B.

In some embodiments, the MOSFET 106B comprises a high-voltage (HV) metal-oxide-semiconductor field-effect transistor (MOSFET) (e.g., having a threshold voltage ($V_{th}$) greater than about 10 V), for enhanced signal-to-noise (S/N) ratio over a comparatively low $V_{th}$ MOSFET.

Figure 2:
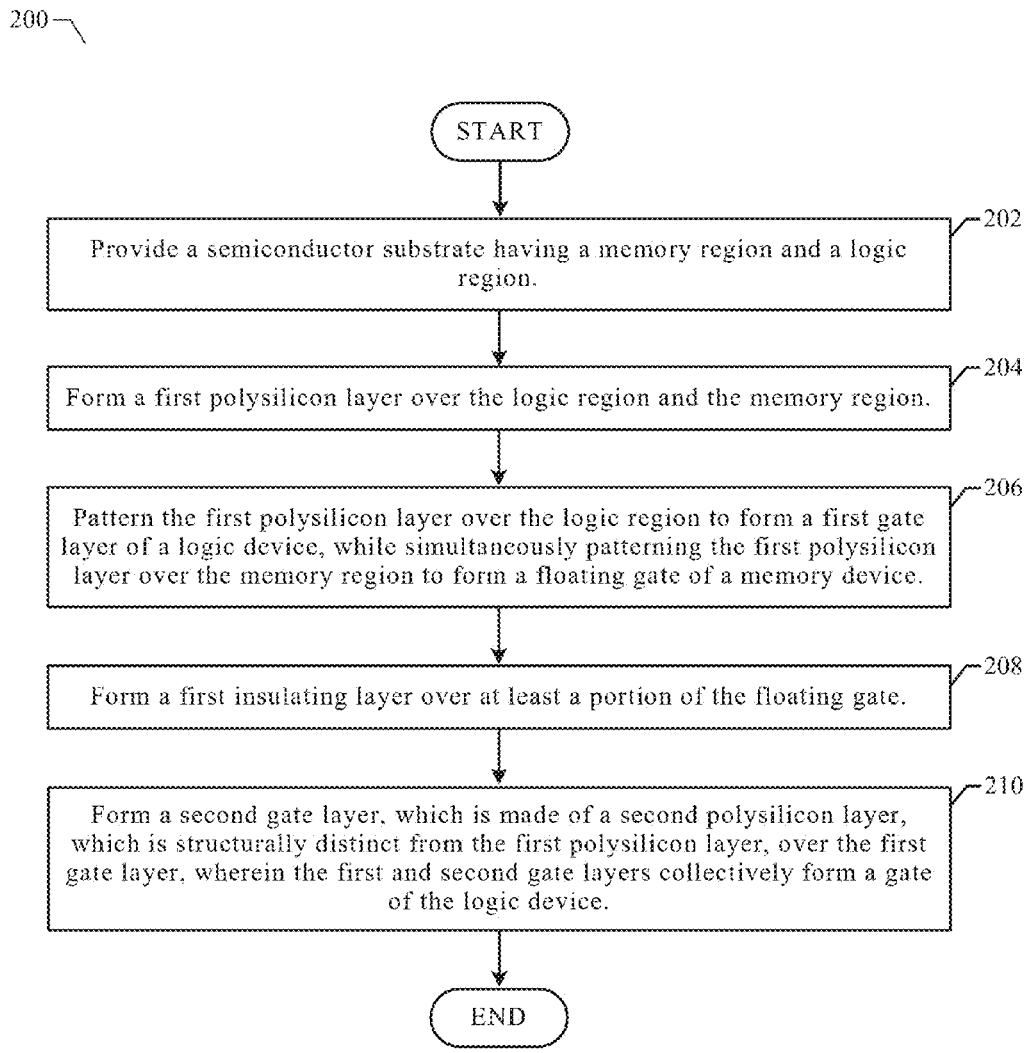
FIG. 2 illustrates some embodiments of a method to form a MOSFET and a split gate flash memory cell in accordance with some embodiments.

FIG. 2 illustrates some embodiments of a method 200 to form a MOSFET and a split gate flash memory cell in accordance with some embodiments. While method 200 is described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, a semiconductor substrate is provided, the semiconductor substrate having a logic region and a memory region. The substrate may comprise bulk silicon, silicon on insulator (SOI), or other type of elementary semiconductor. In some embodiments, the semiconductor substrate may comprise a p-type substrate. In other embodiments, the semiconductor substrate comprises an n-type substrate.

At 204, a first polysilicon layer is formed over the logic region and the memory region of the substrate.

At 206, the first polysilicon layer is patterned over the logic region to form a first gate layer of a logic device (e.g., a MOSFET logic gate). The first polysilicon layer is simultaneously patterned over the memory region, in a single patterning step, to form a floating gate of a memory device (e.g., a split gate flash memory device).

At 208, an insulating layer is formed over at least a portion of the floating gate. In some embodiments, the insulating layer includes an HTO layer formed through thermal oxidation. In such embodiments, the first gate layer of a logic device protects an underlying gate dielectric from damage due to thermal cycling of the gate dielectric during the thermal oxidation, which can introduce defects or degrade the structural uniformity of the gate dielectric.

At 210, a second gate layer is formed. The second gate layer is made of a second polysilicon layer, which is structurally distinct from the first polysilicon layer. The second gate layer is formed over the first gate layer such that the first and second gate layers collectively form a gate of the logic device. In some embodiments, the logic device is subjected to one or more source/drain implant steps after formation of the second gate layer. In such embodiments, the first and second gate layers combine to have a thickness that is sufficiently large enough to prevent dopant implantation into the channel region of the logic device.

Figure 3C:
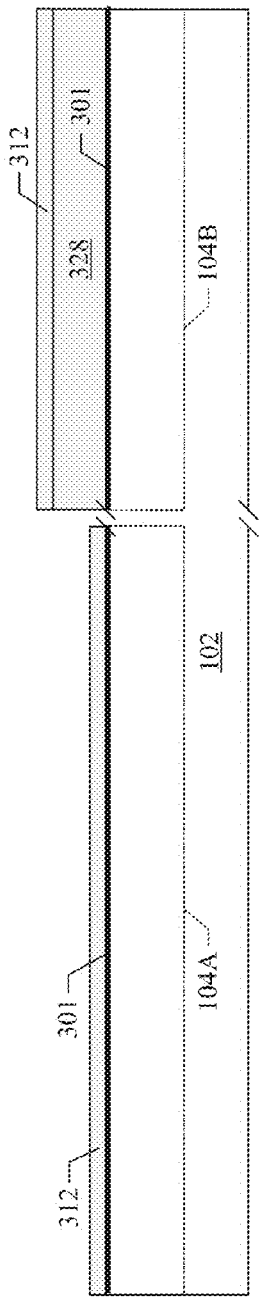
FIGS. 3A-3P illustrate a series of cross-sectional views that depict formation a MOSFET and a split gate flash memory cell in accordance with some embodiments.
Figure 3D:
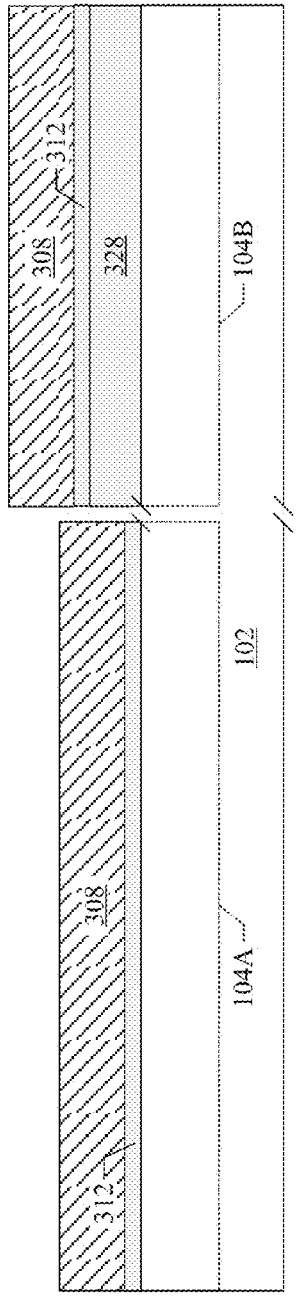
Figure 3G:
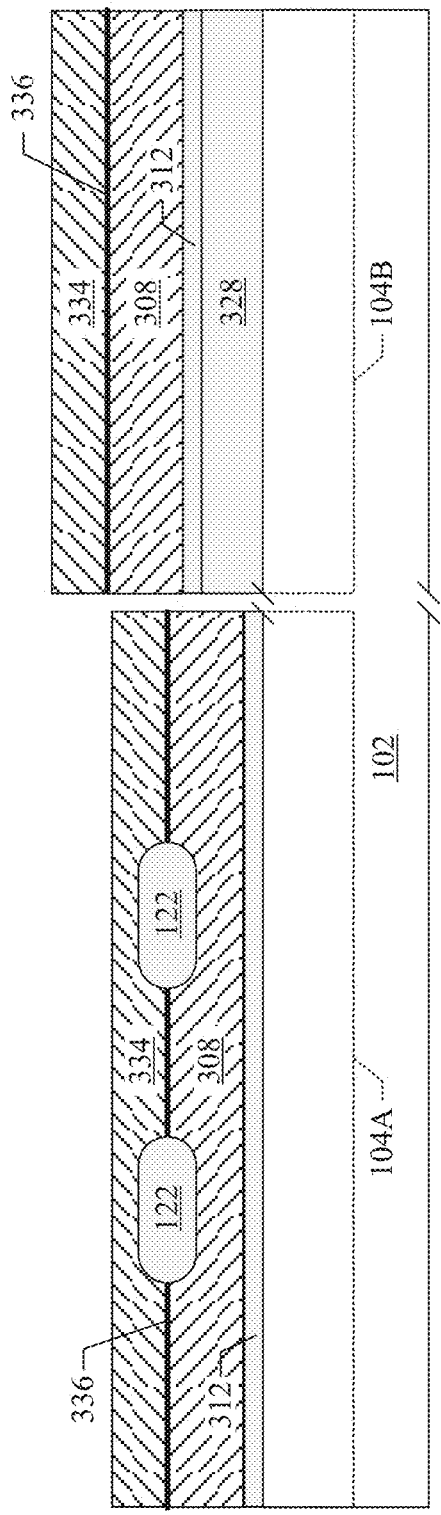
Figure 3H:
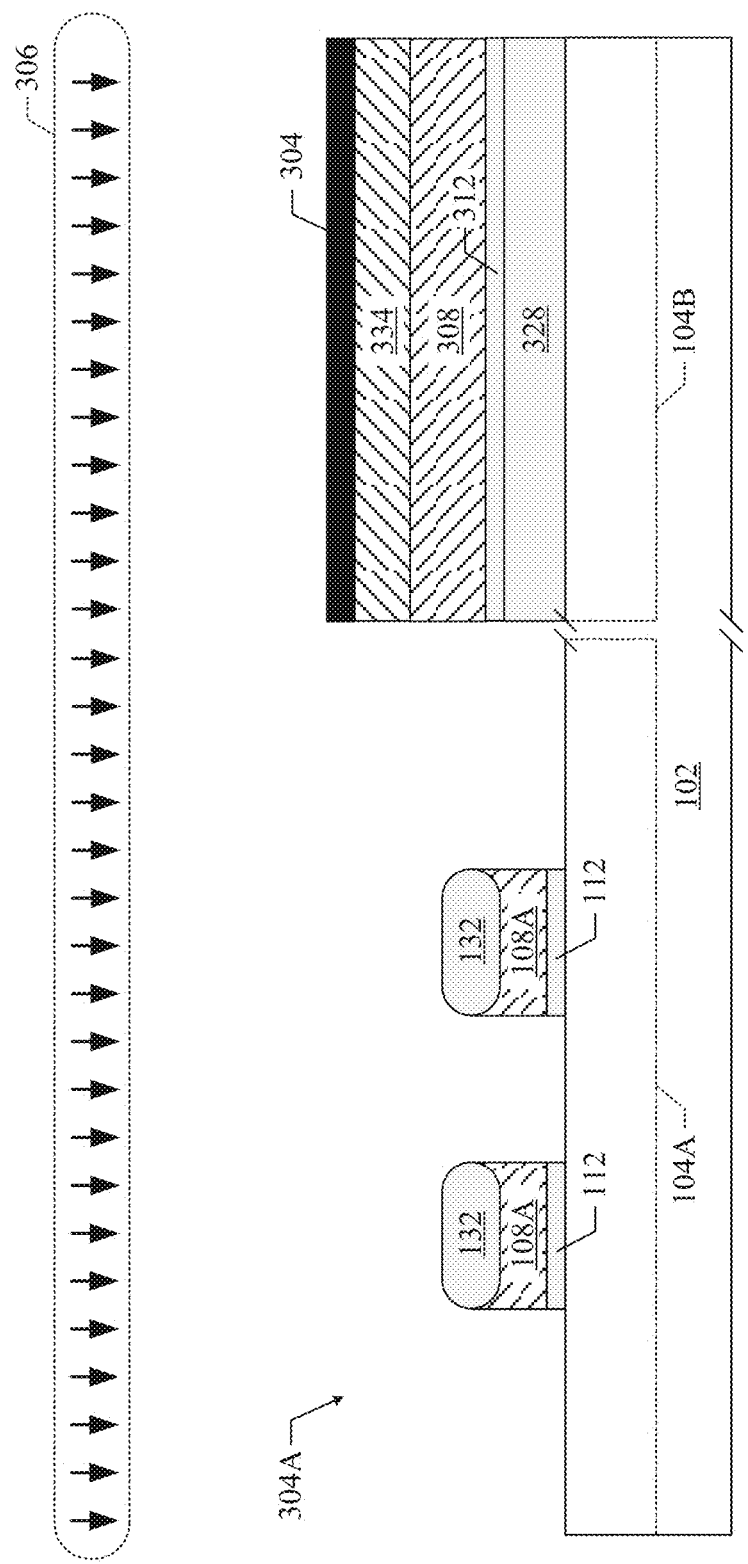
Figure 3I:
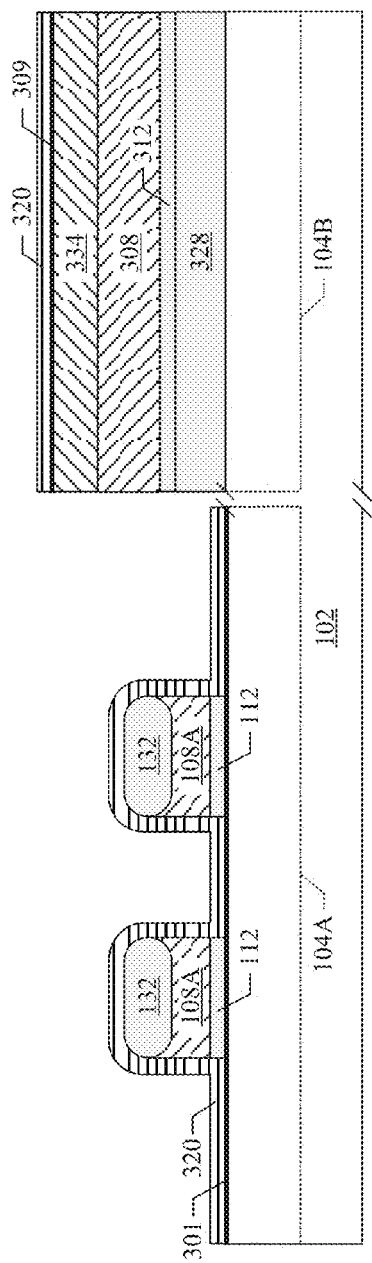
Figure 3J:
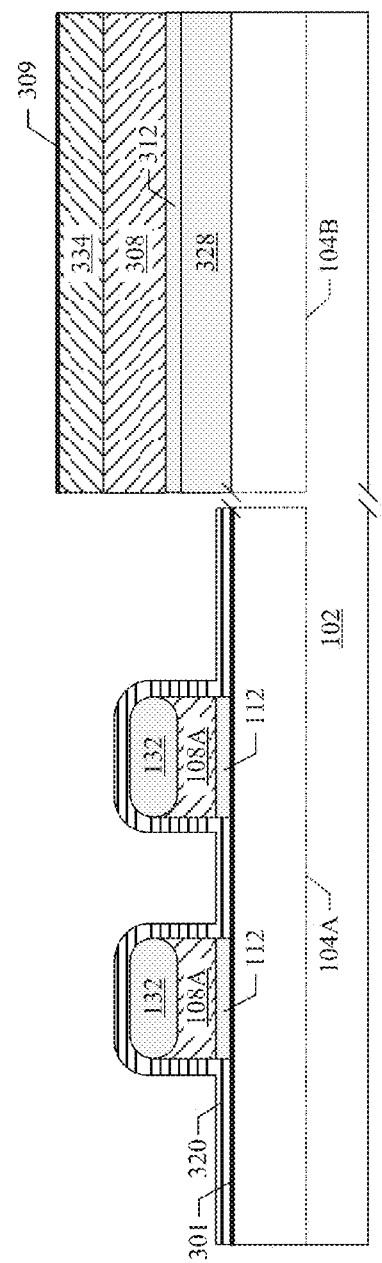
Figure 3K:
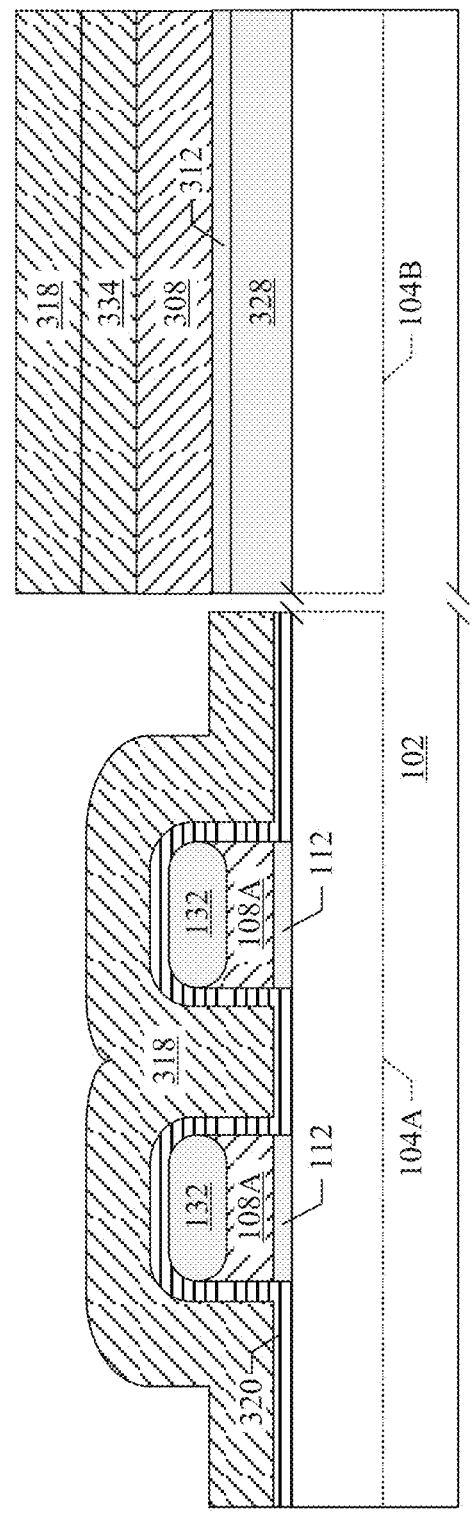
Figure 3L:
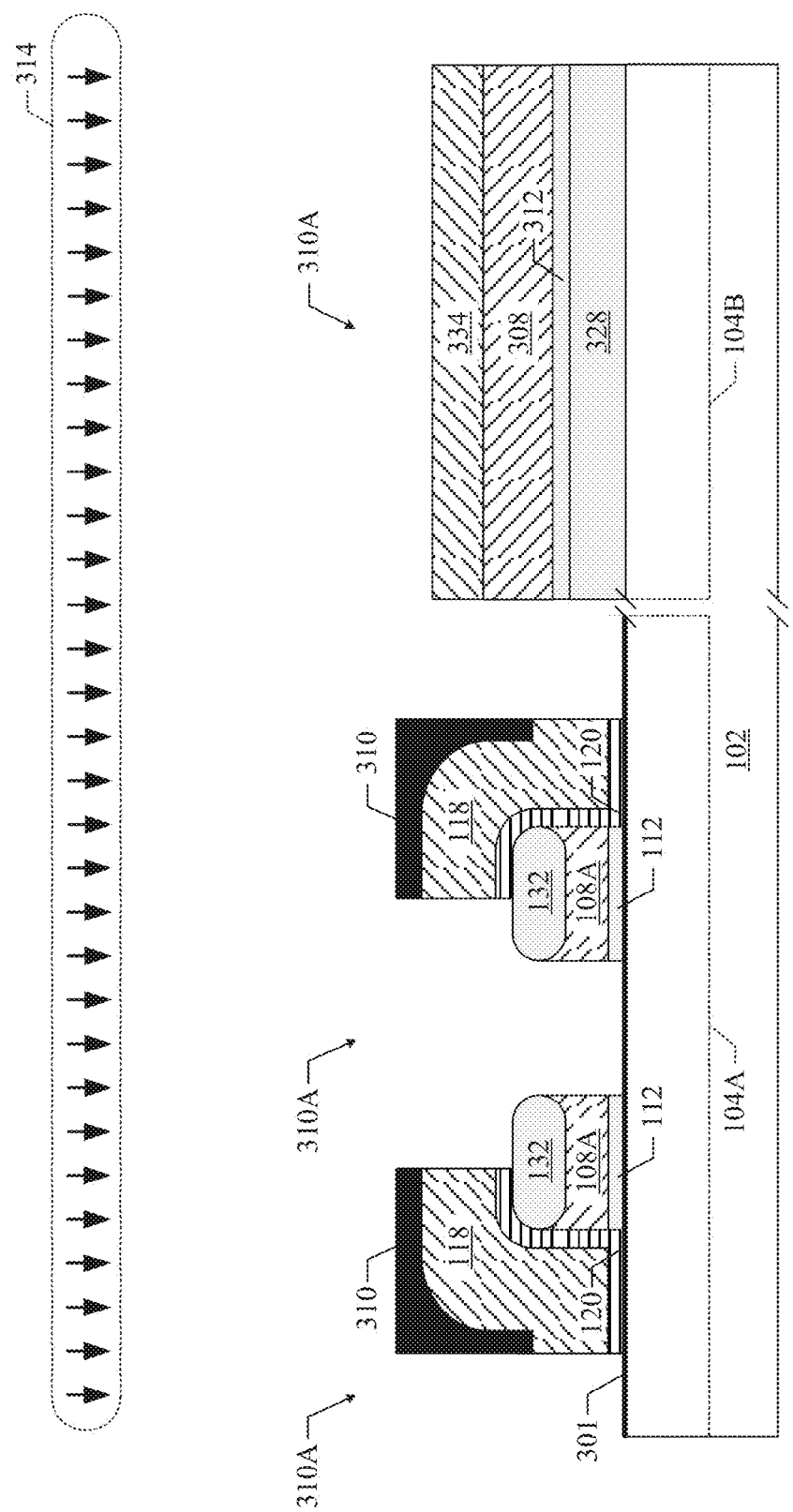
Figure 3M:
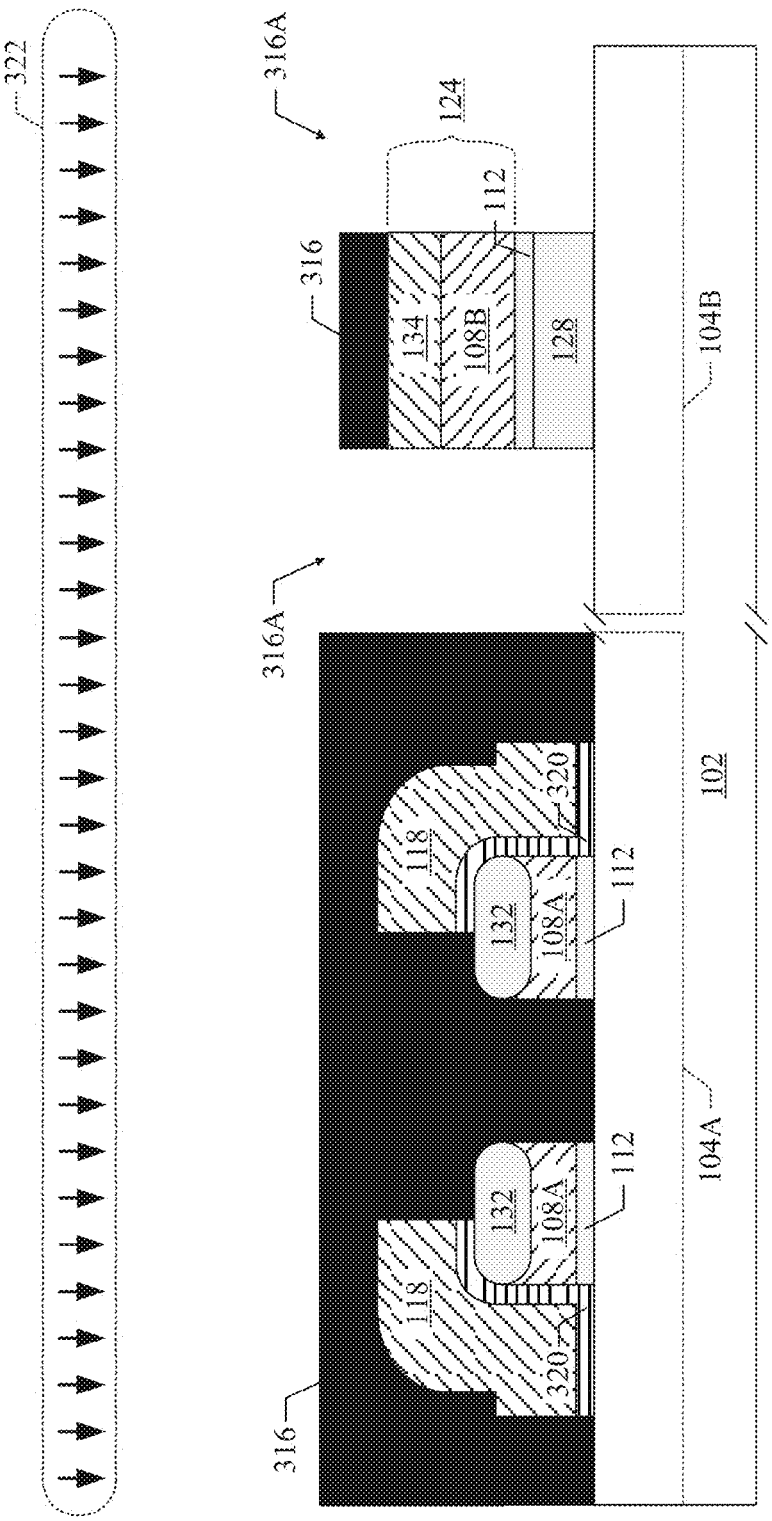
Figure 3N:
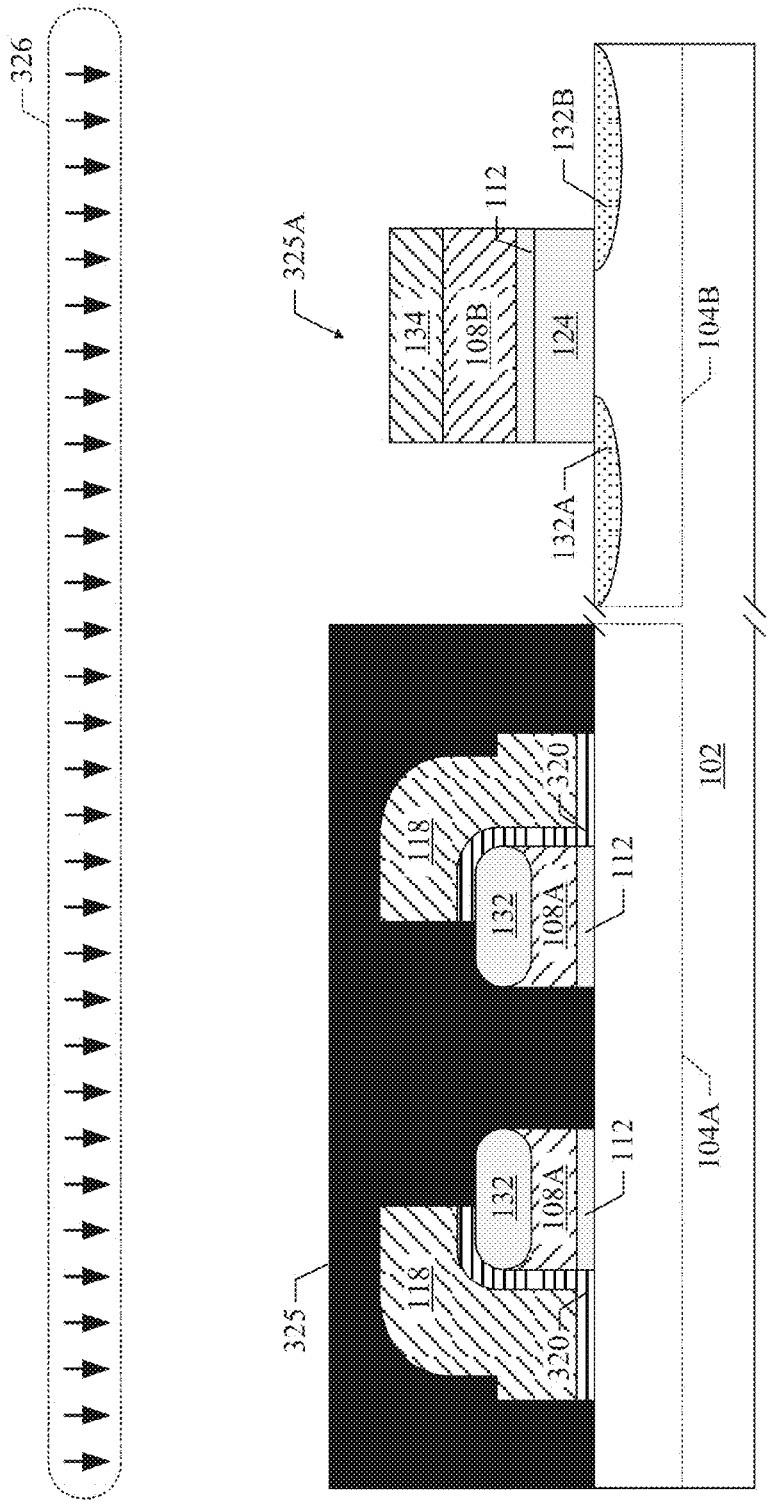
Figure 3O:
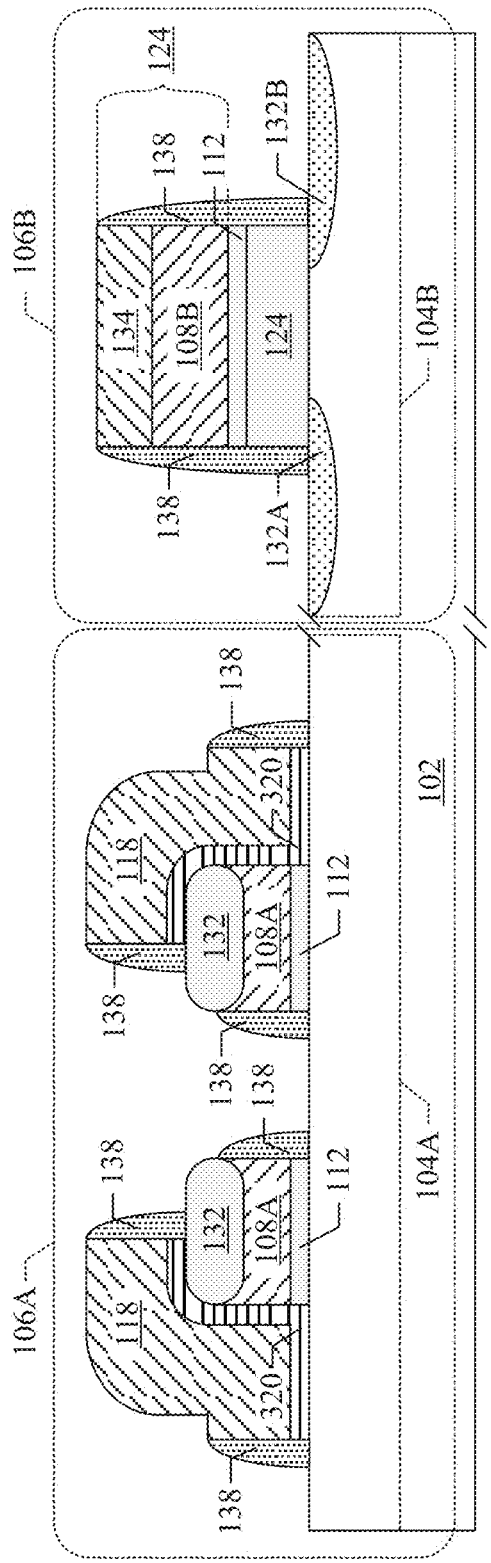
Figure 3P:
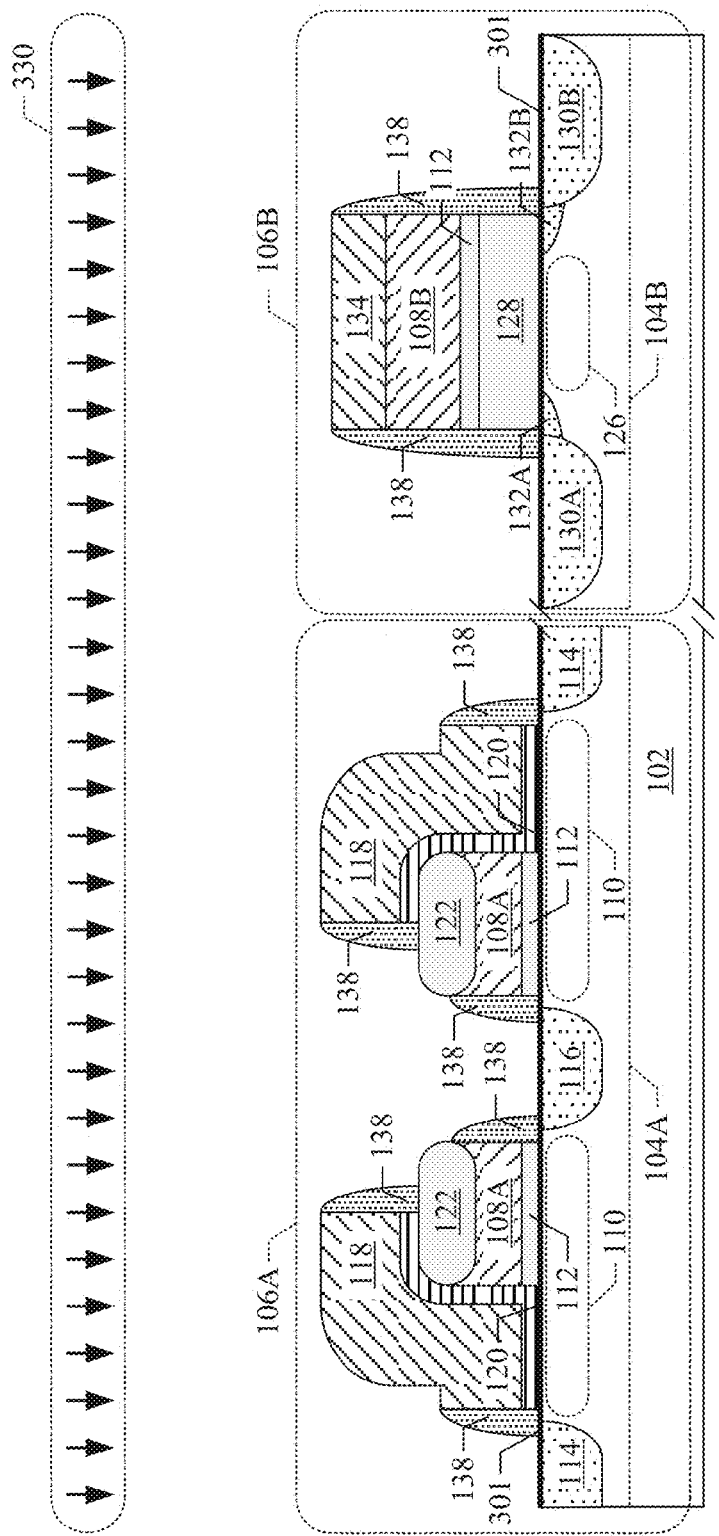

FIGS. 3A-3P illustrate a series of cross-sectional views that depict formation a MOSFET and a split gate flash memory cell on a semiconductor substrate in accordance with some embodiments. Although FIGS. 3A-3P are described in relation to the method 200, it will be appreciated that the structures disclosed in FIGS. 3A-3P are not limited to the method 200, but instead may stand alone as structures independent of the method 200. Similarly, although the method 200 is described in relation to FIGS. 3A-3P, it will be appreciated that the method 200 is not limited to the structures disclosed in FIGS. 3A-3P, but instead may stand alone independent of the structures disclosed in FIGS. 3A-3P.

In FIG. 3A, a semiconductor substrate 102 has been provided. The semiconductor substrate 102 includes a memory region 104A and a logic region 104B. In some embodiments, the memory region 104A and the logic region 104B include wells formed by implantation of donor or acceptor dopants into an upper substrate surface 301 through a patterned mask (e.g., an oxide layer formed and patterned over the surface), which is subsequently removed.

In FIG. 3B, a gate dielectric layer 328 has been formed over the upper substrate surface 301 in the logic region 104B. In some embodiments, the gate dielectric layer 328 is formed over the upper both the memory and logic regions 104A, 104B through chemical vapor deposition (CVD), or other appropriate deposition process. The gate dielectric layer 328 is then subsequently patterned and removed from over the memory region 104A. For embodiments of an e-flash memory device that utilizes an HV MOSFET, the gate dielectric layer 328 is formed with substantial thickness to withstand elevated voltage applied to a gate of the HV MOSFET. In such embodiments, the gate dielectric layer 328 is not shared between the HV MOSFET and split gate flash memory cell (i.e., to form the tunneling dielectric layer of FIG. 3C), because it is too thick to allow for tunneling of electrons from the channel region of the split gate flash memory cell into the floating gate.

In FIG. 3C, a tunneling dielectric layer 312 has been formed over the upper substrate surface 301 within the memory region 104A, and over the gate dielectric layer 328 within the logic region 104B. In various embodiments, the tunneling dielectric layer 312 may include silicon dioxide ($SiO_2$) or a high-k dielectric layer, formed through physical vapor deposition (PVD), CVD, atomic layer deposition (ALD), molecular beam epitaxy (MBE), electron beam (e-beam) epitaxy, or other appropriate process.

In FIG. 3D, a first polysilicon layer 308 has been formed over the tunneling dielectric layer 312 within the memory region 104A and within the logic region 104B. In various embodiments, the first polysilicon layer 308 is disposed over the tunneling dielectric layer 312 through PVD, CVD, ALD, MBE, e-beam epitaxy, or other appropriate deposition process. For example, a CVD process such as low pressure CVD (LPCVD) may be used to form the first polysilicon layer 308, wherein the semiconductor substrate 102 is exposed to one or more silicon precursors within a processing chamber. The first polysilicon layer 308 includes a plurality of first crystalline regions, or "grains," which are formed through the LPCVD process. A growth rate, grain size, and crystalline structure within the first polysilicon layer 308 can be varied by varying LPCVD conditions, which include an ambient pressure or temperature within the processing chamber, a partial pressure or flow rate of the one or more silicon precursors, precursor type, etc. In some embodiments, the first polysilicon layer 308 has a first thickness of about 1,000 angstroms to efficient write/erase functionality of a floating gate subsequently formed from the first polysilicon layer 308.

In FIG. 3E, a first hard mask layer 302 (e.g., silicon nitride (SiN)) is disposed over the first polysilicon layer 308 through PVD, CVD, ALD, MBE, e-beam epitaxy, or other appropriate deposition process.

In FIG. 3F, the first hard mask layer 302 has been patterned to produce first and second openings 303A, 303B in the first hard mask layer 302, which expose an upper surface 305 of the first polysilicon layer 308. Patterning of the first hard mask layer 302 includes one or more photolithographic techniques. A photoresist layer (not shown) is typically spin-coated over the upper surface 305 of the first polysilicon layer 308. The semiconductor substrate 102 is then exposed to radiation (e.g., light), and developed to form a pattern corresponding to the first and second openings 303A, 303B, which is etched into the first hard mask layer 302. The photoresist layer is then removed using conventional techniques, such as stripping, ashing, or the like. Oxide layers 122 are then formed on regions of the upper surface that exposed are first and second openings 303A, 303B through a local oxidation of silicon (LOCOS) technique. In some embodiments, the LOCOS technique thins first polysilicon layer 308 such that a thickness of floating gate 108A of FIG. 1 is substantially less than a thickness of the first gate layer 108B of FIG. 1 due to oxide consumption of the first polysilicon layer 308 during the LOCOS process.

In FIG. 3G, the first hard mask layer 302 has been removed (e.g., through an etch process). A second polysilicon layer 334 has then been formed over the first polysilicon layer 308 and oxide layers 122 within the memory region 104A, and over the first polysilicon layer 308 within the logic region 104B. In various embodiments, the second polysilicon layer 334 is disposed through PVD, CVD, ALD, MBE, e-beam epitaxy, or other appropriate deposition process. The second polysilicon layer 334 includes a plurality of second crystalline regions, or "grains." For the embodiments of FIGS. 3A-3P, the first and second polysilicon layers 308, 324 are structurally distinct due to different thicknesses, different grain sizes between the first and second crystalline regions, different crystalline structures within the various first and second crystalline regions, or different sizes of the first and second crystalline regions themselves. Moreover, for first and second polysilicon layers 308, 334 that each include a variety of crystalline regions of various grain sizes, an average grain size between the first and second polysilicon layers 308, 334 may differ to show the structural distinction. Similarly, a distribution of grain size between the first and second polysilicon layers 308, 334 may differ to show the structural distinction. As a result of their structural differences, a seam 336 is observed between the first and second polysilicon layers 308, 334. In some embodiments, the second polysilicon layer 334 has a second thickness of about 500 angstroms.

In FIG. 3H, a first mask 304 has been formed over the semiconductor substrate 102, which includes a first opening 304A formed over the memory region 104A. In some embodiments, the first mask 304 includes a conformal layer of oxide (e.g., SiO2) or nitride (e.g., SiN), which has been deposited and patterned through photolithography. A first etch is then performed though the first opening 304A, which completely removes the second polysilicon layer 334 from over the memory region. The oxide layers 122 act as an embedded hard mask to prevent etching of the portions of the first polysilicon layer 308 and the tunneling dielectric layer 312 that are covered by the oxide layers 122. The first etch thereby produces the floating gates 108A and the tunneling dielectric 112 of the split gate flash memory cell 106A. A portion of the second polysilicon layer 334 over the logic region 104B covered by an opaque region of the first mask 304. Consequently, the portion of the second polysilicon layer 334 over the logic region 104B is left intact after the first etch. In some embodiments the first etch comprises a dry etch (e.g., a plasma etch with tetrafluoromethane (CF$_4$), sulfur hexafluoride (SF$_6$), nitrogen trifluoride (NF$_3$), etc.).

In FIG. 3I, an insulating layer 320 has been formed over the upper substrate surface 301, the oxide layers 122, the floating gates 108A, and the tunneling dielectric 112 within the memory region 104A, and over an upper surface 309 of the second polysilicon layer 334 within the logic region 104B. In some embodiments, the insulating layer 320 includes a high temperature oxide (HTO) that has been formed through wet or dry oxidation, or a combination thereof. The oxidation includes a high temperature oxidation (e.g., greater than 800° C.), which forms an oxide layer (e.g., SiO$_2$), a nitride layer (e.g., SiN), or a combination thereof (e.g., ONO). The first and second polysilicon layers 308, 334 protect the tunneling dielectric layer 312 and the gate dielectric layer 328 from damage from during the high temperature oxidation. In some embodiments, the tunneling dielectric layer 312 and the gate dielectric layer 328 both comprise an oxide (e.g., SiO$_2$), which can damaged and degraded due to thermal stressing during the high temperature oxidation in the absence of the first and second polysilicon layers 308, 334.

In FIG. 3J, portions of the insulating layer 320 are removed from over the upper surface 309 of the second polysilicon layer 334 within the logic region 104B. In various embodiments, removal of the portions of the insulating layer 320 from within the logic region 104B includes a pattern and etch process, wherein a mask (e.g., nitride, oxide, photoresist, etc.) is formed and patterned through photolithography, which forms an opening in the mask over the logic region 104B. The insulating layer 320 over the logic region 104B is then etched through the opening, while the insulating layer 320 over the memory region 104A blocked by an opaque region of the photomask, and thusly is left intact.

In FIG. 3K, a third polysilicon layer 318 (e.g., polysilicon) has been formed over the insulating layer 320 within the memory region 104A, and over the second polysilicon layer 334 within the logic region 104B. In various embodiments, formation of the third polysilicon layer 318 includes PVD, CVD, ALD, MBE, e-beam epitaxy, or other appropriate deposition process. In some embodiments, the third polysilicon layer 318 has a third thickness of about 2,000 angstroms.

In FIG. 3L, a second mask 310 has been formed over the semiconductor substrate 102. The second mask 310 includes second openings 310A over portions of the memory region 104A (i.e., over source and drain regions) and over the logic region 104B. A second etch is then performed, using one or more wet or dry etchants 314, with the second mask 310 in place to remove portions of the third polysilicon layer 318 from within the areas of memory region 104A under the second openings 310A, and from over the logic region 104B. In some embodiments, the one or more wet or dry etchants 314 comprise dry etchants such as CF$_4$, SF$_6$, NF$_3$, and the like. In some embodiments, the one or more wet or dry etchants 314 comprise a wet etchants such as hydrofluoric acid (HF), potassium hydroxide (KOH), tetramethylammonium hydroxide (TMAH), and the like. The second etch also removes portions of the insulating layer 320 under the second openings 310A to expose the upper substrate surface 301 in those regions. The second etch thereby forms the control gates 118 and the insulating layer 120 of the split gate flash memory cell 106A of FIG. 1.

In FIG. 3M, a third mask 316 has been formed over the semiconductor substrate 102. The third mask 316 includes third openings 316A over portions of the logic region 104B, and covers the memory region 104A. A third etch is then performed, using one or more wet or dry etchants 322, with the third mask 316 in place to form the logic gate 124 and gate dielectric 128 of the MOSFET 106B. The logic gate 124 comprises portions of the first and second polysilicon layers 308, 334, which remain after the third etch to form the logic gate 124. In various embodiments, the one or more wet or dry etchants 322 include CF$_4$, SF$_6$, NF$_3$, HF, KOH, TMAH, and the like.

In FIG. 3N, a fourth mask 325 has been formed over the semiconductor substrate 102. The fourth mask 325 includes a fourth opening 325A over the logic region 104B. Dopants 326 have then then implanted through the fourth opening 325A to form first and second lightly doped drain (LDD) regions 132A, 132B (and to dope the logic gate 124). In some embodiments, the dopants 326 include acceptors such as boron (B), aluminum (Al), gallium (Ga), indium (In), etc., which form p-type LDD regions 132A, 132B. In other embodiments, the dopants 326 include donors such as nitrogen (N), phosphorous (P), arsenic (As), antimony (Sb), or bismuth (Bi), etc., which form n-type LDD regions 132A, 132B.

In FIG. 3O, sidewall spacers 138 have been formed on sidewalls of the floating gates 108A, the control gates 118, and the logic gate 124, to prevent subsequent source/drain implants from penetrating to close to channel regions of the split gate flash memory cell 106A and MOSFET 106B. Formation of the sidewall spacers 138 includes disposal of a conformal spacer layer (e.g., SiO$_2$), which is then etched back by an etch process (e.g., a plasma etch), leaving portions of the spacer layer on the sidewalls of the floating gates 108A, the control gates 118, and the logic gate 124.

In FIG. 3P, source/drain dopants 330 have been implanted into the semiconductor substrate 102 through the upper substrate surface 301 to form the common source region 116 and the individual drain regions 114 of the split gate flash memory cell 106A, and the first and second source/drain regions 130A, 130B of the MOSFET 106B. In some embodiments, the source/drain dopants 330 include acceptors such as B, Al, Ga, In, etc. In other embodiments, the source/drain dopants 330 include donors such as N, P, As, Sb, Bi, etc. The first and second gate layers 108B, 134 of the logic gate 124 have a sufficient thickness (e.g., greater than 1,500 angstroms) to block the source/drain dopants 330 from penetrating through the logic gate 124 and into the channel region 126 of the MOSFET 106B. Upon implantation of the source/drain dopants 330, the split gate flash memory cell 106A and the MOSFET 106B of the e-flash memory device 100 are fully formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Therefore, some embodiments of the present disclosure are directed to an embedded flash (e-flash) memory device that includes a flash memory cell and a metal-oxide-semiconductor field-effect transistor (MOSFET). The flash memory cell includes a control gate disposed over a floating gate. The MOSFET includes a logic gate disposed over a gate dielectric. The floating gate and a first gate layer of the logic gate are simultaneously formed with a first polysilicon layer. A high temperature oxide (HTO) is then formed over the floating gate with a high temperature process, while the first gate layer protects the gate dielectric from degradation effects due to the high temperature process. A second gate layer of the logic gate is then formed over the first gate layer by a second polysilicon layer. The first and second gate layers collectively form a logic gate of the MOSFET.

Some embodiments relate to an integrated circuit, comprising a semiconductor substrate including a memory region and a logic region. A memory device is arranged over the memory region. The memory device includes a floating gate arranged over a channel region of the memory device. A logic device is arranged over the logic region. The logic device includes a gate arranged over a channel region of the logic device. The gate comprises a first polysilicon layer arranged below a second polysilicon layer, wherein the first and second polysilicon layers are structurally distinct from one another.

Other embodiments relate to an integrated circuit, comprising a semiconductor substrate including a memory region and a logic region. A logic device is arranged over the logic region. The logic device includes a gate that is separated from a channel region of the logic device by a gate dielectric. The gate comprises a first polysilicon layer arranged below a second polysilicon layer, wherein the first and second polysilicon layers are structurally distinct from one another. A memory device is arranged over the memory region. The memory device includes a floating gate that is separated from a channel region of the memory device by a tunneling dielectric, which is thinner than the gate dielectric. The memory device also includes a control gate formed over at least a portion of the floating gate, and an insulating layer configured to electrically isolate the control gate from the floating gate.

Still other embodiments relate to a method, including providing a semiconductor substrate having a logic region and a memory region, and forming a first polysilicon layer over the logic region and the memory region. The method further includes patterning the first polysilicon layer over the logic region to form a first gate layer of a logic device, while simultaneously patterning the first polysilicon layer over the memory region to form a floating gate of a memory device. The method further includes forming an insulating layer over at least a portion of the floating gate. The method further includes forming a second gate layer, which is made of a second polysilicon layer, and which is structurally distinct from the first polysilicon layer, over the first gate layer, wherein the first and second gate layers collectively form a gate of the logic device.

What is claimed is:

1. An integrated circuit, comprising:
    a semiconductor substrate including a memory region and a logic region;
    a memory device arranged over the memory region, the memory device including a floating gate arranged over a channel region of the memory device; and
    a logic device arranged over the logic region, the logic device including a gate arranged over a channel region of the logic device, wherein the gate comprises a first polysilicon layer arranged below a second polysilicon layer, wherein the first polysilicon layer has a first average grain size and the second polysilicon layer has a second average grain size, wherein the first average grain size is different than the second average grain size.

2. The integrated circuit of claim 1, wherein the first and second polysilicon layers are structurally distinct in that the first and second polysilicon layers abut one another at a seam, which makes the first and second polysilicon layers distinct.

3. The integrated circuit of claim 1, further comprising:
    a tunneling dielectric configured to electrically isolate the floating gate from the channel region of the memory device;
    a control gate formed over at least a portion of the floating gate, wherein the control gate is configured to promote tunneling of electrons between the channel region of the memory device and the floating gate through the tunneling dielectric; and
    an insulating layer configured to electrically isolate the control gate from the floating gate.

4. The integrated circuit of claim 3, wherein the insulating layer comprises one or more oxide layers, one or more nitride layers, or a combination thereof.

5. The integrated circuit of claim 3,
    wherein the first polysilicon layer has a first thickness;
    wherein the second polysilicon layer has a second thickness that is less than the first thickness; and
    wherein the control gate is made of polysilicon and has a third thickness that is greater than the first thickness.

6. The integrated circuit of claim 3, further comprising an oxide layer disposed on an upper surface of the floating gate below the insulating layer.

7. The integrated circuit of claim 6, further comprising a second memory device that shares a common source region with the memory device.

8. The integrated circuit of claim 1, further comprising:
    a source region and a drain region that are laterally separated by the channel region of the memory device, which resides below the floating gate of the memory device; and an erase gate disposed over the source region of the memory device, wherein the erase gate is configured to promote tunneling of electrons between the floating gate and the erase gate.

9. The integrated circuit of claim 1, wherein the logic device further comprises a pair of sidewall spacers extending continuously along sidewalls of the first and second polysilicon layers and from an upper surface of the second polysilicon layer to an upper surface of the semiconductor substrate.

10. The integrated circuit of claim 9, wherein the memory device further comprises:
a control gate comprising a lower control gate portion arranged along a first sidewall of the floating gate and an upper control gate portion which extends over an upper surface of the floating gate and which is continuous with the lower control gate portion; and
an insulating layer configured to electrically isolate the control gate from the floating gate.

11. The integrated circuit of claim 10, further comprising:
a floating gate spacer arranged along a second sidewall of the floating gate, the second sidewall being opposite the first sidewall of the floating gate; and
first and second control gate spacers arranged on opposite sidewalls of the control gate, wherein the first control gate spacer is disposed along a sidewall of the lower control gate portion and the second control gate spacer is disposed along a sidewall of the upper control gate portion.

12. An integrated circuit, comprising:
a semiconductor substrate including a memory region and a logic region;
a logic device arranged over the logic region, the logic device including a gate that is separated from a channel region of the logic device by a gate dielectric, wherein the gate comprises a first polysilicon layer arranged below a second polysilicon layer, wherein the first polysilicon layer has a first average grain size and the second polysilicon layer has a second average grain size, wherein the first average grain size is different than the second average grain size; and
a memory device arranged over the memory region, the memory device including:
a floating gate that is separated from a channel region of the memory device by a tunneling dielectric, which is thinner than the gate dielectric;
a control gate formed over at least a portion of the floating gate; and
an insulating layer configured to electrically isolate the control gate from the floating gate.

13. The integrated circuit of claim 12, wherein the first polysilicon layer, the second polysilicon layer, and the control gate have different thicknesses.

14. The integrated circuit of claim 12, wherein the first polysilicon layer and the floating gate have about a same thickness.

15. The integrated circuit of claim 12, wherein the logic device further comprises a pair of sidewall spacers extending continuously along sidewalls of the first and second polysilicon layers and from an upper surface of the second polysilicon layer to an upper surface of the semiconductor substrate.

16. The integrated circuit of claim 15, wherein the control gate comprises a lower control gate portion arranged along a first sidewall of the floating gate and an upper control gate portion which extends over an upper surface of the floating gate and which is continuous with the lower control gate portion.

17. The integrated circuit of claim 16, further comprising:
a floating gate spacer arranged along a second sidewall of the floating gate, the second sidewall being opposite the first sidewall of the floating gate; and
first and second control gate spacers arranged on opposite sidewalls of the control gate, wherein the first control gate spacer is disposed along a sidewall of the lower control gate portion and the second control gate spacer is disposed along a sidewall of the upper control gate portion.

18. An integrated circuit, comprising:
a semiconductor substrate including a memory region and a logic region;
a memory device arranged over the memory region, the memory device including:
a floating polysilicon gate arranged over a channel region of the memory device;
a control gate comprising a lower control gate portion arranged along a first sidewall of the floating polysilicon gate and an upper control gate portion which extends over an upper surface of the floating polysilicon gate and which is continuous with the lower control gate portion; and
an insulating layer configured to electrically isolate the control gate from the floating polysilicon gate;
a logic device arranged over the logic region, the logic device including:
a gate arranged over a channel region of the logic device, wherein the gate comprises a first polysilicon layer arranged below a second polysilicon layer, wherein the first and second polysilicon layers are in direct electrical contact with one another and are structurally distinct from one another, wherein the floating polysilicon gate and the first polysilicon layer have the same thickness as one another; and
a pair of sidewall spacers extending continuously along sidewalls of the first and second polysilicon layers and from an upper surface of the second polysilicon layer to an upper surface of the semiconductor substrate; and
a floating gate spacer arranged along a second sidewall of the floating polysilicon gate, the second sidewall opposite the first sidewall of the floating polysilicon gate; and
first and second control gate spacers arranged on opposite sidewalls of the control gate, wherein the first control gate spacer is disposed along a sidewall of the lower control gate portion and the second control gate spacer is disposed along a sidewall of the upper control gate portion.

19. The integrated circuit of claim 18, further comprising:
an oxide layer disposed on the upper surface of the floating gate and disposed between the floating gate and the insulating layer.

20. The integrated circuit of claim 18, wherein the first and second polysilicon layers are structurally distinct in that the first and second polysilicon layers abut one another at a seam, which makes the first and second polysilicon layers distinct.

* * * * *